US006618264B2

(12) United States Patent
Megason et al.

(10) Patent No.: US 6,618,264 B2
(45) Date of Patent: Sep. 9, 2003

(54) TOOL-LESS COUPLING SYSTEM FOR ELECTRONIC MODULES

(75) Inventors: George D. Megason, Spring, TX (US); Joseph R. Allen, Tomball, TX (US); Henry C. Coles, Saratoga, CA (US); Dit Charoen, Houston, TX (US)

(73) Assignee: Hewlett-Packard-Company, L.P., Houston, TX (US)

( * ) Notice: Subject to any disclaimer, the term of this patent is extended or adjusted under 35 U.S.C. 154(b) by 0 days.

(21) Appl. No.: 09/995,472

(22) Filed: Nov. 28, 2001

(65) Prior Publication Data

US 2003/0099096 A1 May 29, 2003

(51) Int. Cl.[7] .................................................. H05K 7/14
(52) U.S. Cl. ........................ 361/759; 361/740; 361/801; 211/41.17; 200/52 R; 200/336
(58) Field of Search ................................ 361/740, 759, 361/801; 70/432; 211/41.17; 200/52 R, 61.39, 293, 296, 318, 336

(56) References Cited

U.S. PATENT DOCUMENTS

| | | | | | |
|---|---|---|---|---|---|
| 4,648,009 | A | * | 3/1987 | Beun et al. ................. | 361/759 |
| 4,875,867 | A | * | 10/1989 | Hoo ............................ | 439/157 |
| 5,373,133 | A | * | 12/1994 | Brockway et al. .......... | 200/335 |
| 5,601,349 | A | * | 2/1997 | Holt ......................... | 312/265.6 |
| 5,673,175 | A | * | 9/1997 | Carney et al. .............. | 361/686 |
| 5,822,196 | A | * | 10/1998 | Hastings et al. ............ | 361/801 |
| 5,989,043 | A | * | 11/1999 | Han et al. ................... | 439/157 |
| 6,182,173 | B1 | * | 1/2001 | Grosser et al. ............. | 710/302 |
| 6,232,676 | B1 | * | 5/2001 | Kozyra et al. .............. | 307/113 |

* cited by examiner

*Primary Examiner*—Jayprakash N. Gandhi

(57) ABSTRACT

A technique is provided for coupling and uncoupling device boards for a computer system during any operational state of the computer system. A tool-free latch assembly is provided for coupling a device switchboard and the device boards to a mounting structure of the computer system. The tool-free latch also may have a transparent portion for transmitting light from a device status light to interior and exterior areas of the computer system. A non-mechanical switch also may be utilized in conjunction with the tool-free latch assembly to control power to the device boards.

20 Claims, 6 Drawing Sheets

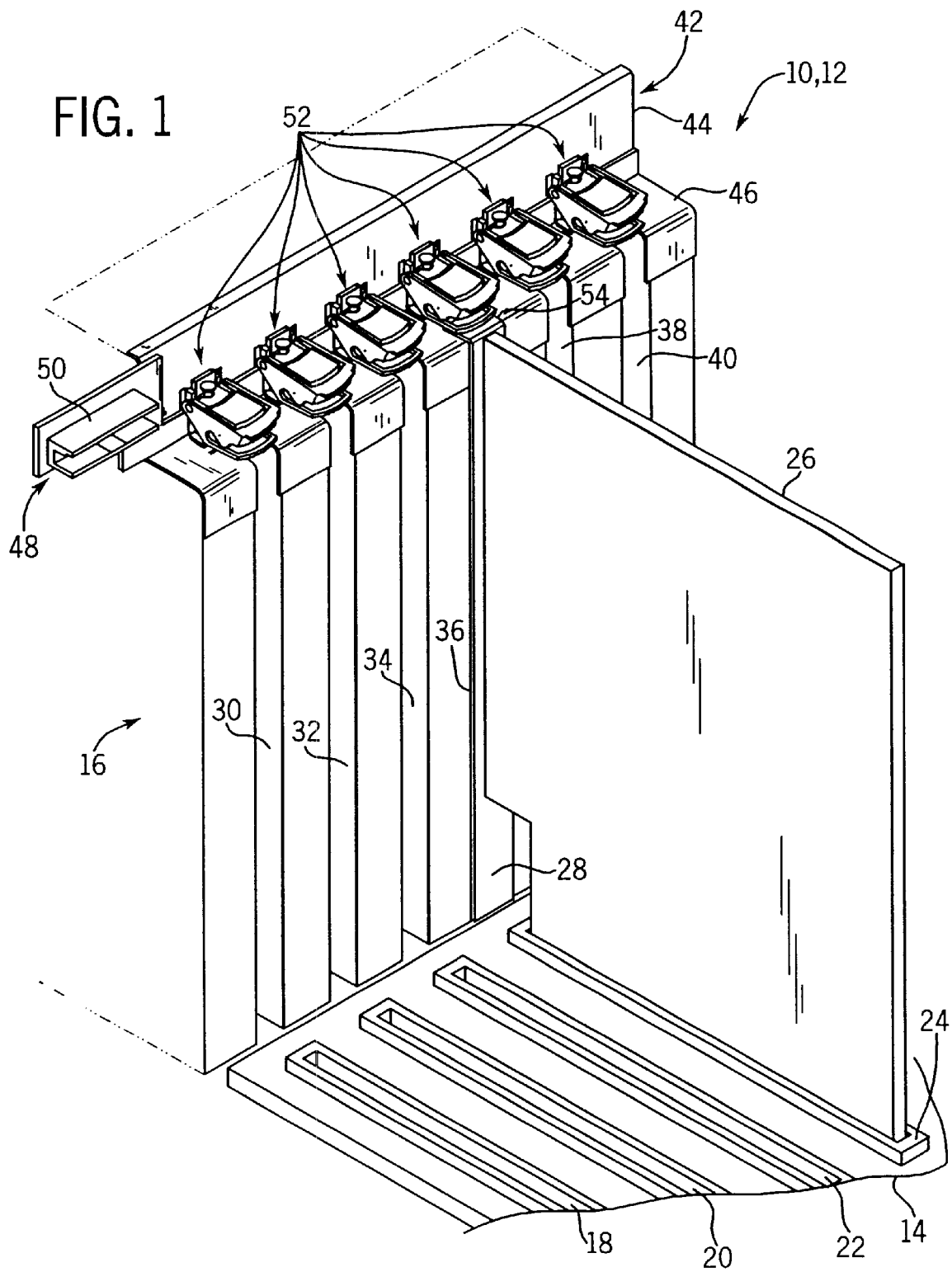

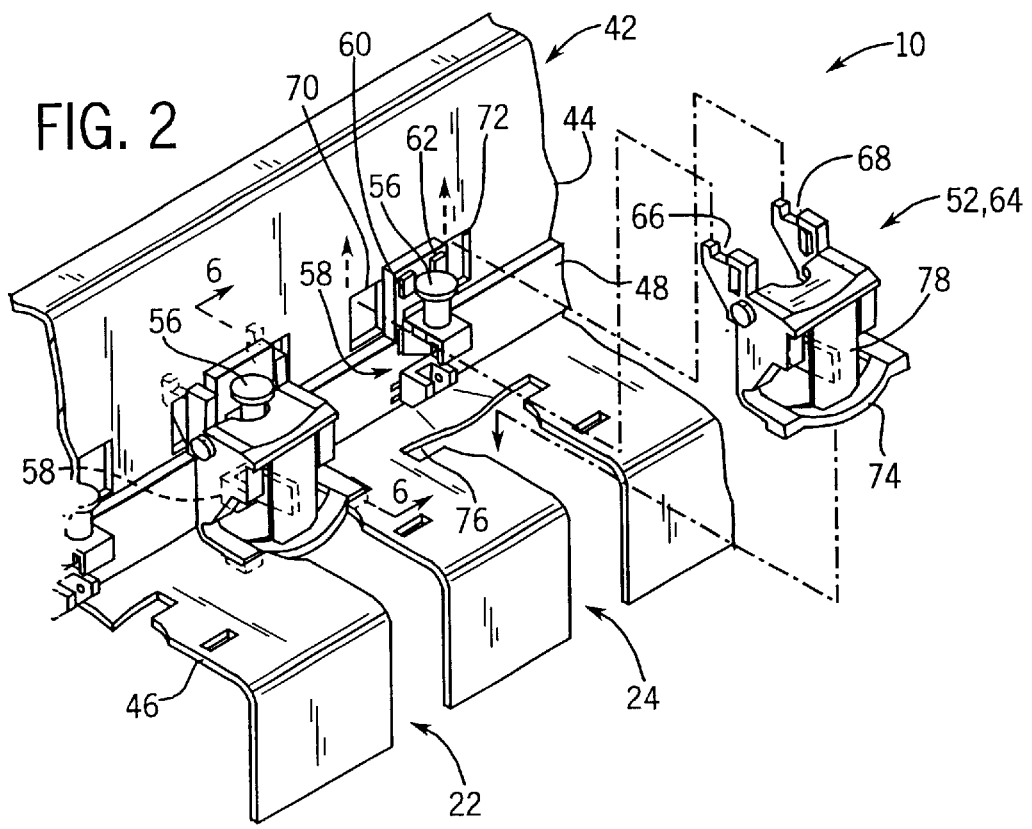

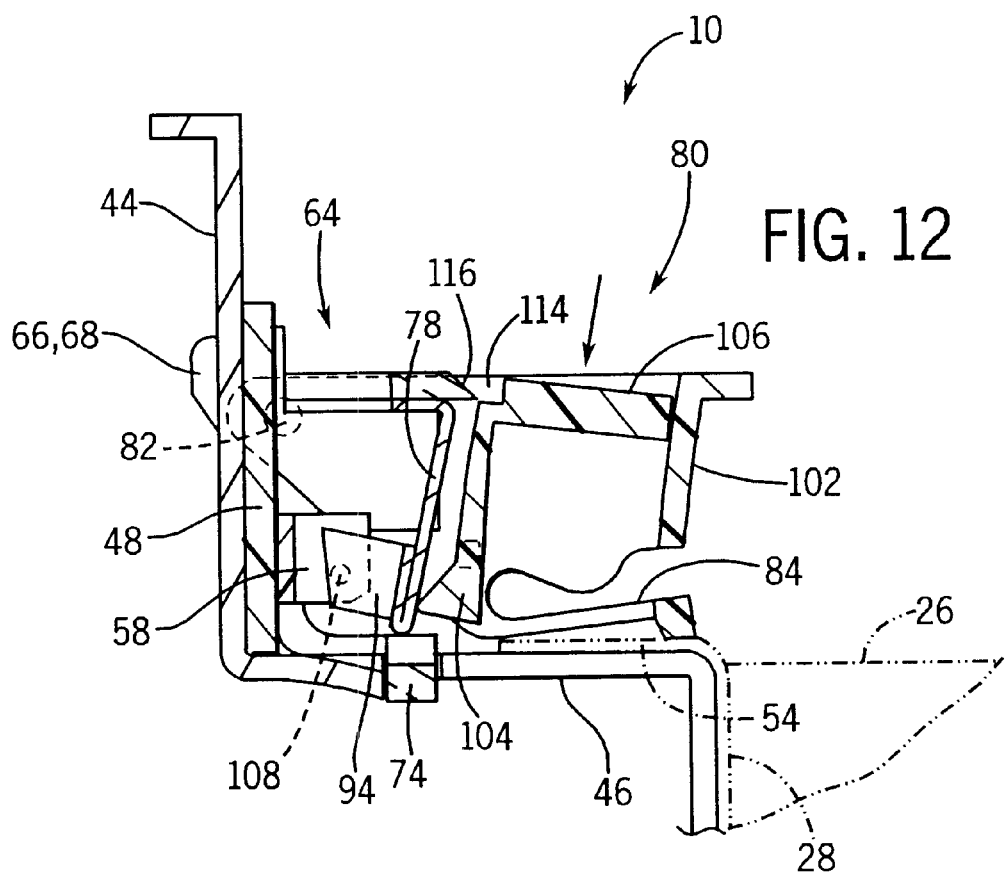
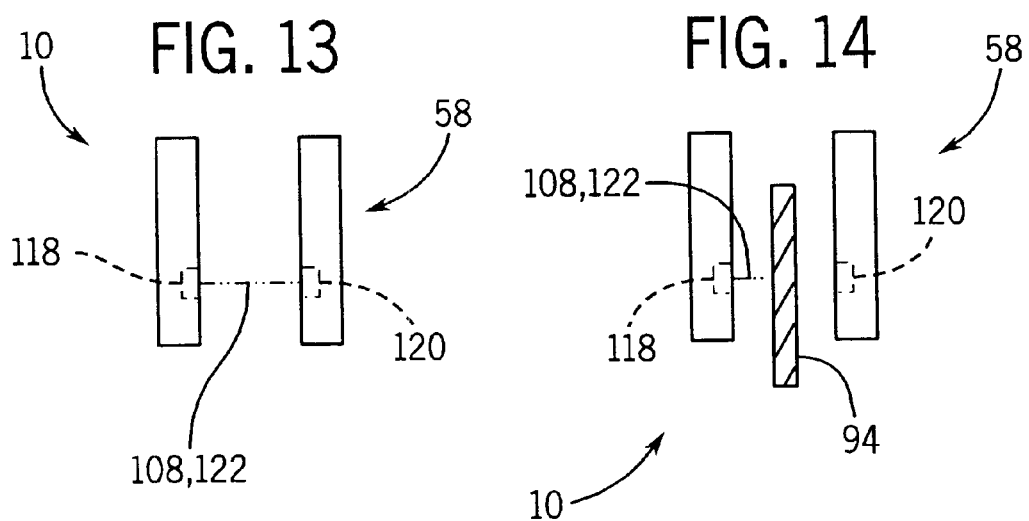

TOOL-LESS COUPLING SYSTEM FOR ELECTRONIC MODULES

FIELD OF THE INVENTION

The present technique relates generally to the field of computer systems and, more specifically, to a unique coupling system for electronic modules, such as circuit boards. The present technique comprises a tool-less latch for coupling one or more electronic modules or circuit boards to a computing device. The present technique also provides a non-mechanical switch for toggling a power status of the desired electronic module or circuit board. A multi-viewable indicator assembly is also provided to indicate a device status at multiple viewing locations.

BACKGROUND OF THE INVENTION

Computer systems generally include a computer housing having a motherboard, a processor, a hard drive, random access memory (RAM), a disk drive (e.g., a floppy drive, a CD-ROM drive, a DVD-ROM drive, a tape drive, etc.), communication ports, a cooling system (e.g., a fan), a power supply, a modem, a network device, an audio assembly (e.g., a sound card, a speaker, etc.), and various other devices. Many of these devices embody a device board, such as PCI or EISA, which is removably inserted into a device slot on the motherboard of the computer system. It is also common to provide switchboards or hot-plug circuitry to allow insertion and removal of the desired device during operation of the computer system. However, existing hot-plug assemblies typically have delicate circuitry, attachment mechanisms requiring a tool for insertion and removal, and various other inefficiencies reducing the simplicity of using and increasing the cost of manufacturing the hot-plug assemblies.

Accordingly, a technique is needed for reducing the complexity, cost and operation of mounting electronic modules, such as circuit boards, switchboards, device modules, and various other electronic and computing modules. More particularly, a need exists for a tool-less coupling assembly, which has a tool-less mount structure and a tool-less latch structure for removably securing one or more desired electronic modules. It also would be advantageous to configure the tool-less mount structure for tool-lessly securing a device switchboard for the electronic modules, while the tool-less latch structure secures the desired electronic modules. A need also exists for a durable electrical switch for the device switchboard and corresponding electronic modules. It also would be advantageous to orient all circuitry on a single side of the device switchboard and provide a light indicator assembly having fewer lights than existing device switchboards.

SUMMARY OF THE INVENTION

A technique is provided for coupling and uncoupling device boards for a computer system during any operational state of the computer system. A tool-free latch assembly is provided for coupling a device switchboard and the device boards to a mounting structure of the computer system. The tool-free latch also may have a transparent portion for transmitting light from a device status light to interior and exterior areas of the computer system. A non-mechanical switch, such as an optical switch or Hall effect sensor, also may be utilized in conjunction with the tool-free latch assembly to control power to the device boards.

In one aspect, the present technique provides an attachment assembly for device boards for a computing device. The attachment assembly comprises a first latch portion and a second latch portion rotatably coupleable to the first latch portion. The first latch portion comprises a tool-free mount structure configured for coupling to the computing device. The second latch portion comprises a closed orientation configured to secure a device board in a slot of the computing device.

In another aspect, the present technique provides a system of controlling power for a device of a computer system for coupling and uncoupling of the device at a desired status of the computer system. The system comprises a mechanical latch assembly for the device and a switch assembly configured for controlling power to the device removably coupled to the computer system. The switch assembly comprises a signal module comprising a wireless path and an interference member movably disposed between orientations clearing and blocking the wireless path, wherein the interference member is coupled to the mechanical latch.

In another aspect, the present technique provides a device coupling assembly for a computer system. The device coupling assembly comprises a power switch assembly configured for controlling power to a slot for a device removably insertable into the slot. The device coupling assembly also has a power status light coupled to the power switch assembly. A transparent member is also disposed adjacent the power status light for transmitting light from the power status light to interior and exterior portions of the computer system.

BRIEF DESCRIPTION OF THE DRAWINGS

The invention will hereafter be described with reference to the accompanying drawings, wherein like reference numerals denote like elements, and:

FIG. 1 is a perspective view of an exemplary device coupling system of the present technique, illustrating a tool-less latch assembly for mounting circuitry in a desired device;

FIG. 2 is a perspective view of a base section of the tool-less latch assembly disposed in a latch mount chassis;

FIG. 3 is a perspective view of the tool-less latch assembly disposed in the latch mount chassis, illustrating an open configuration;

FIG. 12 is a cross-sectional side view of the tool-less latch assembly being released from the closed configuration;

FIG. 13 is a front view of an exemplary non-mechanical switch of the present technique, illustrating an unobstructed position; and FIG. 14 is a front view of the non-mechanical switch in an obstructed position corresponding to the closed configuration of the tool-less latch assembly.

DETAILED DESCRIPTION OF SPECIFIC EMBODIMENTS

Figure 4:
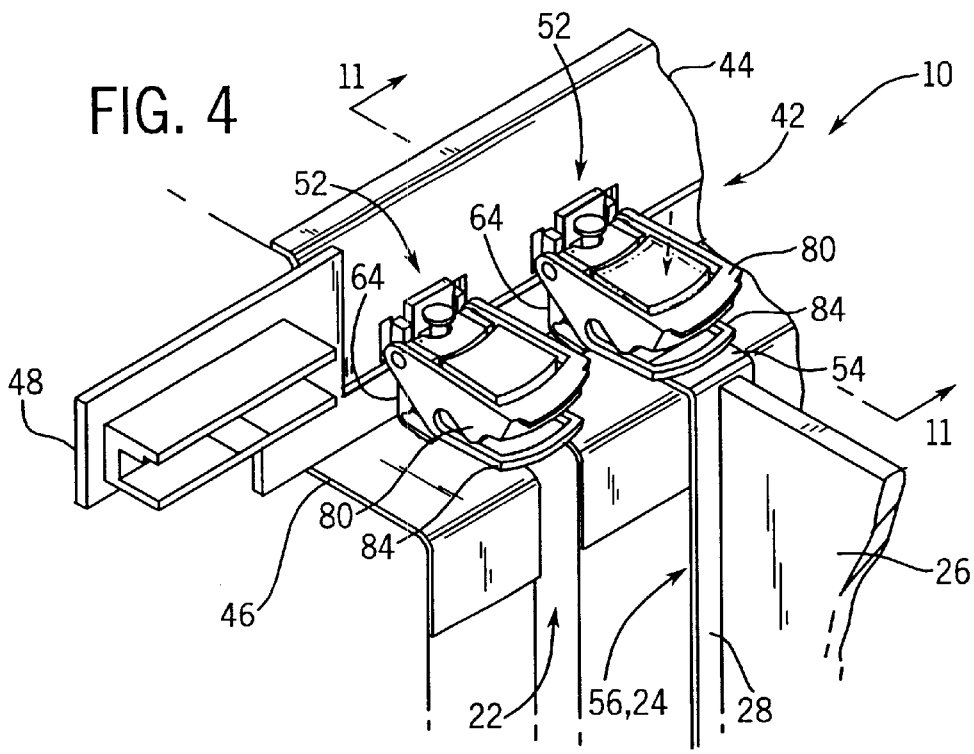
FIG. 4 is a perspective view of the tool-less latch assembly disposed in the latch mount chassis, illustrating a closed configuration.

As described in detail below, the present technique provides a unique device coupling system 10 for electronics and computing devices. The present technique may be utilized in desktop computers, portable computers, servers, workstations, and various other electronics and computing devices. In particular, the present technique is useful for coupling circuit boards to a chassis or to a motherboard of a computing device. The device coupling system 10 advantageously couples one or more circuit boards to the chassis or motherboard without the use of any tools or separate fasteners. Moreover, the device coupling system 10 utilizes transparent material to transmit light from status lights to a plurality of internal and external locations. The device coupling system 10 also may utilize optical technologies to improve accuracy and durability. Accordingly, as described below, the present technique may utilize a variety of these features to provide a unique device coupling system 10 for circuits and devices in any desired electronic or computing device.

As illustrated in FIG. 1, the device coupling system 10 may be incorporated into a computing device 12, which has a circuit board 14 and an input output section 16. The circuit board 14, which may be a computer motherboard, may include a plurality of electrical connectors slots, such as electrical connectors slots 18, 20, 22 and 24. The electrical connectors slots 18 through 24 may embody male or female electrical connectors in any suitable configuration, such as an EISA slot, an ISA slot, a PCI slot, or a USB slot. The computing device 12 also may have a device or circuit board mechanically disposed and electrically coupled in each of these slots 18 through 24 to provide desired input/output or computing functions. For example, a circuit board 26 may be disposed in the electrical connectors slot 24, as illustrated in FIG. 1.

As illustrated, the circuit board 26 has an input output panel 28 disposed adjacent the input output section 16. The input output panel 28 may comprise a variety of communications connectors and indicators, such as a parallel port, a serial port, a USB port, a midi/game port, a modem or network port, an audio/video port, a wireless port (e.g., IRDA, optical, radio frequency, blue tooth technology, etc.), and any other desired input output features. The input output section 16 includes a plurality of input output slots, such as input output slots 30, 32, 34, 36, 38 and 40, which are configured to accept device input output panels. For example, the input output panel 28 of the circuit board 26 is disposed adjacent the input output slot 36 of the input output section 16. Accordingly, some of the various communications connectors and indicators described above may be accessible through the input output slot 36.

As illustrated, the computing device 12 also includes a latch mount chassis 42 disposed adjacent the input output section 16. The latch mount chassis 42 may include a variety of mounting surfaces, such as vertical panel 44 and horizontal panel 46, which may be utilized to facilitate mounting of the circuit board 26 and various other circuitry to the computing device 12. As illustrated, in addition to the devices mountable in the electrical connectors slots 18 through 24, the computing device 12 may include a device switchboard 48 for these respective devices. The device switchboard 48 may have a variety of circuitry and electrical plugs, such as electrical plug 50, to power and control the respective devices mounted in the electrical connectors slots. It should also be noted that the device switchboard 48 may comprise hot-plug circuitry to facilitate insertion and removal of the respective devices during operation of the computing device 12.

In the present technique, the device coupling system 10 comprises a tool-less latch assembly 52 disposed over each of the input output slots 30 through 40. In this exemplary embodiment, the tool-less latch assembly serves multiple functions, including coupling and uncoupling of the device switchboard 48 and the respective devices disposed in the respective electrical connectors slots. As illustrated in FIG. 1, the tool-less latch assembly 52 is removably and tool-lessly secured over a lip 54 of the input output panel 28. Each of the tool-less latch assemblies 52 is also disposed removably and tool-lessly over portions of the device switchboard 48. The following FIGS. 2–14 illustrate the mechanics of the tool-less latch assembly 52, while also more fully illustrating the unique features of the device coupling system 10.

Specific details of the device switchboard 48 and the tool-less latch assembly 52 are illustrated in FIG. 2. As illustrated, the device switchboard 48 is mounted against the vertical panel 44 by the tool-less latch assembly 52. Various circuitry and switches are disposed on the device switchboard 48 to control powering and operation of the desired devices (e.g., the circuit board 26). For example, the device switchboard 48 may have a plurality of switches 56 and 58.

In this exemplary embodiment, a user may depress one of the switches 56 to initiate a change in the operational status of the desired device. For example, the user may depress one of the switches 56 to notify the desired device and the computing device 12 of a desired shutdown, to command the completion of all pending operations of the desired device, to receive a signal (e.g., a device status) indicating the completion of pending operations, and to allow the user to remove the desired device without interrupting pending operations of the desired device. The switch 56 also may proceed to cut the power to the desired device, or the switch 58 may independently control the power status of the desired device. Accordingly, the device switchboard 48 may indicate the device status by powering an indicator light (e.g., an LED), such as amber and green indicator lights 60 and 62, which may correspond to the status of operations, power, or other characteristics of the desired device.

In addition to control via the switches 56, the switches 58 interact with the tool-less latch assembly 52 to provide automatic/immediate shut off or power down during unlatching and removal of the desired devices from the computing device 10. As the tool-less latch assembly 52 is toggled between latched and unlatched positions, the switch 58 immediately changes the power status of the desired device. Accordingly, the switches 58 cut the power in any scenario, including an accidental release of the desired device, a controlled removal of the desired device following completion of operations by the switch 56, or an intentional release of the desired device during operations of the desired device. The switch 58 also toggles the indicator lights 60 and 62 to convey the power status of the desired device. In an exemplary embodiment of the present technique, the switches 58 embody non-mechanical or wireless switch mechanisms, such as optical switch mechanisms, magnetic switch mechanisms, position sensor switch mechanisms, Hall-effect sensors, or any other suitable switch mechanism.

A base section 64 of the tool-less latch assembly 52 is also illustrated in FIG. 2. The base section 64 is mountable to the latch mount chassis 42 over the device switchboard 48 by inserting hooks 66 and 68 of the base section 64 into slots 70 and 72 in the vertical panel 44. The base section 64 is then rotated about the slots 70 and 72 downwardly until a curved tab 74 of the base section 64 snaps into a slot 76 in the horizontal panel 46 adjacent the respective input output slot (e.g., input output slot 22 or 24). Accordingly, the base section 64 operates as a tool-free latch for mounting the device switchboard 48. As described above, dashed lines are provided in FIG. 2 to illustrate the base section 64 being inserted into the slots 70 and 72 and the slot 76, which are disposed over the input output slot 24 for the circuit board 26. FIG. 2 also illustrates one of the base sections 64 mounted in the slots 70 and 72 and the slot 76 over the input output slot 22. A rear perspective view of this mounting mechanism is also provided in FIG. 5, which is discussed in detail below.

In addition to serving as a tool-free latch for the device switchboard 48, the base section 64 may comprise a transparent material to transmit light from the indicator lights 60 and 62 to multiple viewing locations. For example, a transparent embodiment of the base section 64 can transmit light through the slots 70 and 72, thereby providing status information for the desired device on the interior and exterior of the computing device 10. Light also may be transmitted through the base section 64 and the slot 76 if sufficiently light is provided by the indicator lights 60 and 62. As described above, the indicator lights 60 and 62 are triggered by both of the switches 56 (e.g., "notify" switches) and the switches 58 (e.g., optical or Hall-effect switches). In operation, the "notify" switch 56 initiates a shutdown process, which completes all pending operations before shutdown of the corresponding electronic module or circuit board. In contrast, the "optical" or "Hall-effect" switch 58 immediately cuts or returns the power to the corresponding electronic module or circuit board. In this exemplary embodiment, the base section 64 also includes a switch position or interrupt member 78, which may be flexibly moved between first and second or blocked and unblocked positions relative to the switch 58. This interrupt member 78 is movable by an arm section 80 of the tool-less latch assembly to control the power status of the desired device during mounting and removal from the respective slots. The operation of this interrupt member 78 is described in further detail below with reference to FIGS. 6–7 and 10–12.

The arm section 80 is rotatably coupled to the base section 64 at a hinge assembly 82, thereby allowing the arm section 80 to rotate between latched and unlatched orientations, as illustrated by the horizontal and vertical orientations in FIGS. 3 and 4, respectively. Accordingly, the arm section 80 may be rotated about the hinge assembly 82 upwardly to the unlatched, or vertical, orientation to release and remove the circuit board 26 from the input output slot 24, as illustrated in FIG. 3. The arm section 80 also may be rotated about the hinge assembly 82 downwardly to the latched, or horizontal, orientation to pressure the lip of the input output panel downwardly to secure the desired device in the desired electrical connector slot (e.g., the circuit board 26 in the electrical connector slot 24), as illustrated in FIG. 4. The arm section 80 also includes a flexible latch member 84, which springably abuts the lip 54 in the latched, or horizontal, orientation of the arm section 80. As illustrated, this flexible latch member 84 embodies a U-shaped geometry. However, the flexible latch member 84 may comprise any suitable geometry, material, and spring components to provide pressure against the lip 54. It should also be noted that rotation of the arm section 80 about the hinge assembly 82 toggles the interrupt member 78 of the base section 64 to control the switch 58, as described above with reference to FIG. 2. The specifics of this interaction will be discussed in further detail below.

Figure 5:
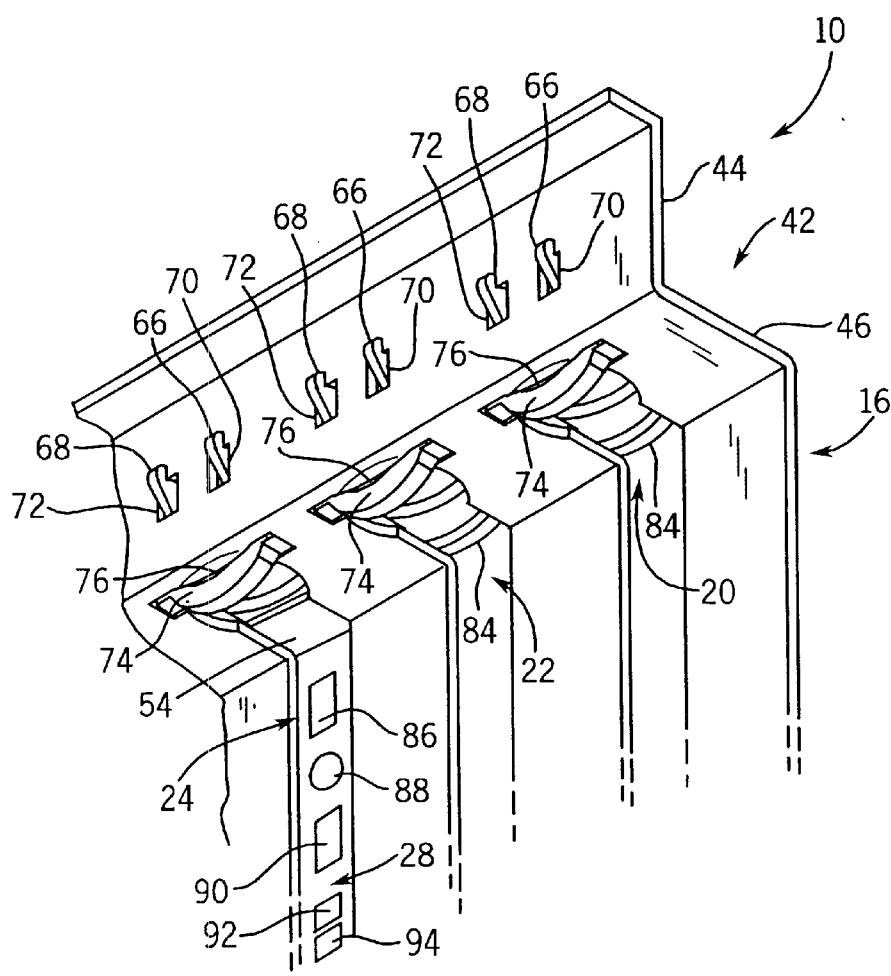
FIG. 5 is rear perspective view of the tool-less latch assembly disposed in the latch mount chassis.

As mentioned above, a rear perspective view of the latch mount chassis 42 and the input output section 16 is provided in FIG. 5. As illustrated, the hooks 66 and 68 extend through the slots 70 and 72 and latch around the vertical panel 44 within the slots 70 and 72. In this exemplary embodiment, sufficient room is provided within the slots 70 and 72 to facilitate rotation of the hooks 66 and 68 within the slots 70 and 72, as described above with reference to FIG. 2. These hooks 66 and 68 and the curved tab 74 also may serve as indicator lights, as described above, where the base section 64 is composed of a transparent material and is positioned adjacent the indicator lights 60 and 62. It should also be noted that the curved tab 74 protrudes significantly from the slot 76, thereby securing the snap-fit between the curved tab 74 and the slot 76. The protrusion of the curved tab 74 also provides a release mechanism for freeing the curved tab 74 from the slot 76 (and also, for freeing the base section 64 from the latch mount chassis 42). To remove the base section 64, the curved tab 74 is pressed upwardly and the base section 64 is caused to rotate about the hooks 66 and 68 disposed in the slots 70 and 72. The base section 64 is then removed from the slots 70 and 72. Any other suitable latching or snap-fitting mechanism also may be utilized within the scope of the present technique. As illustrated in the input output section 16, the panel 28 has a plurality of connectors, such as connectors 86, 88, 90, 92 and 94 (e.g., parallel port, serial port, USB port, modem port, Ethernet port, audio/video port, etc.), which are accessible through slot 24 from the rear/exterior of the computing device 10.

Figure 6:
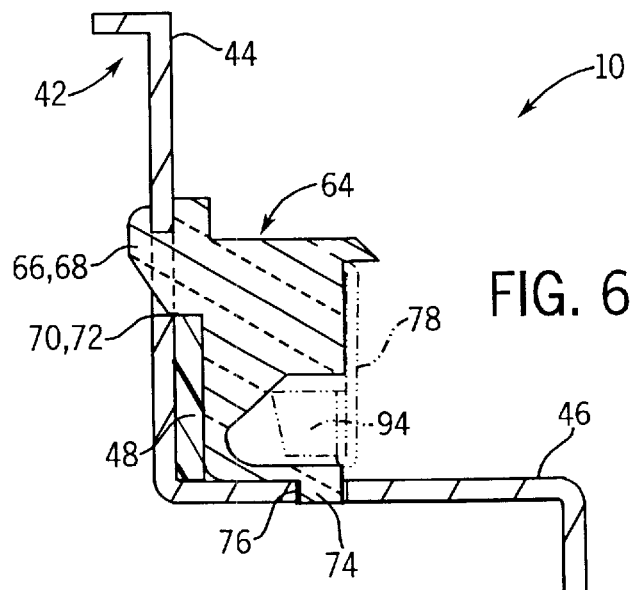
FIG. 6 is a cross-sectional side view of the base section disposed in the latch mount chassis, as illustrated in FIG. 2.

Referring back to the tool-less latch assembly 52, various unique features and functions of the tool-less latch assembly 52 are illustrated in detail in FIGS. 6 through 14. As mentioned above in FIG. 2, the base section 64 includes the interrupt member 78 for toggling between on and off positions with the switch 58, which is disposed on the device switchboard 48. A cross-sectional view of the base section 64 is illustrated in FIG. 6. The base section 64 is mounted to the latch mount chassis 42 with the hooks 66 and 68 removably disposed in the slots 70 and 72 and the curved tab 74 removably disposed in the slot 76. As illustrated, the base section 64 surrounds the device switchboard 48 and toollessly secures it on both sides (e.g., the vertical panel 44 and the horizontal panel 46). As discussed above, the tool-less latch assembly 52 also interacts with the device switchboard 48 to control the desired devices disposed in the electrical connector slots. For example, the interrupt member 78 (e.g., optical interrupt, Hall-effect, or wireless control member) disposed on the base section 64 interacts with the switch 58 disposed on the device switchboard 48.

Figure 7:
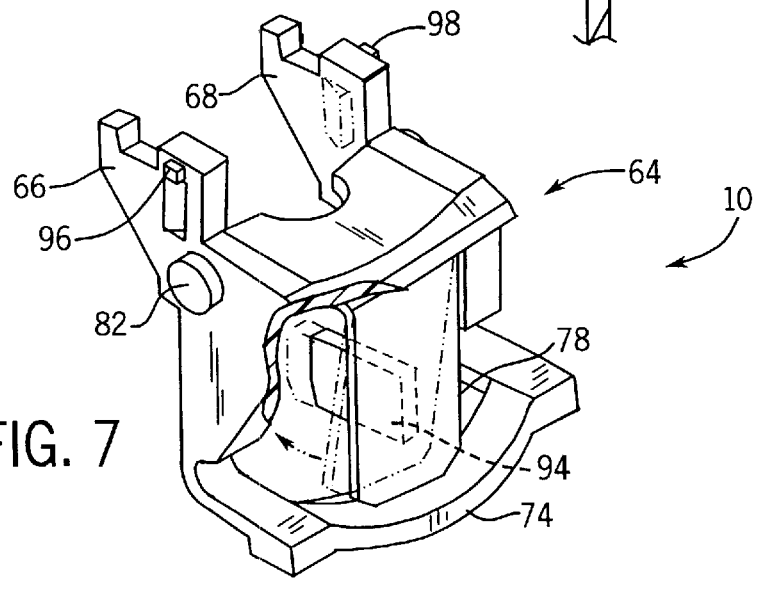
FIG. 7 is a perspective view of the base section.

An exemplary geometry of the interrupt member 78 is also illustrated in FIG. 6. As illustrated, the interrupt member 78 includes a protruding member 94, which extends inwardly toward the vertical panel 44 and the device switchboard 48. The interrupt member 78 may comprise a variety of geometries and materials. However, in this exemplary embodiment, the interrupt member 78 comprises a flexible metallic structure. Accordingly, the interrupt member 78 may be flexibly moved inwardly and outwardly with respect to the device switchboard 48, as illustrated in FIG. 7. The specific details of the interaction between the interrupt member 78 and the switch 58 are discussed below with reference to FIGS. 10 through 12.

The functionality and interaction between the base and arm section 64 and 80 are best understood with reference to FIGS. 7 through 14. As illustrated in FIG. 7, the base section 64 includes retention tabs 96 and 98 adjacent the hooks 66 and 68 and the hinge assembly 82. These retention tabs 96 and 98 are provided to secure the arm section 80 in an upright or unlatched orientation, as illustrated in FIG. 3. For example, as the arm section 80 is rotated about the hinge assembly 82 upwardly toward the hooks 66 and 68, an inner body portion 100 of the arm section 80 pressurably moves over the retention tabs 96 and 98 to provide resistance against a downward latching motion of the arm section 80.

Figure 9:
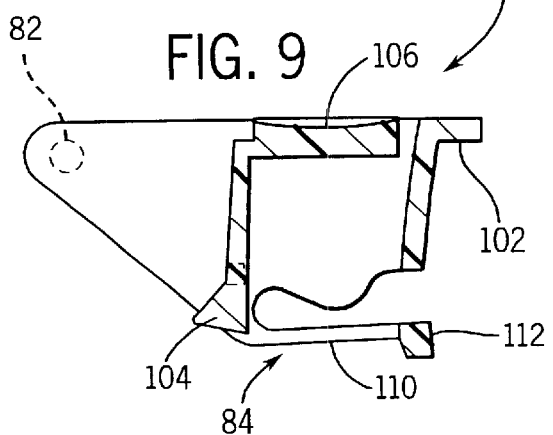
FIG. 9 is a cross-sectional side view of the arm section, as illustrated in FIG. 8.
Figure 8:
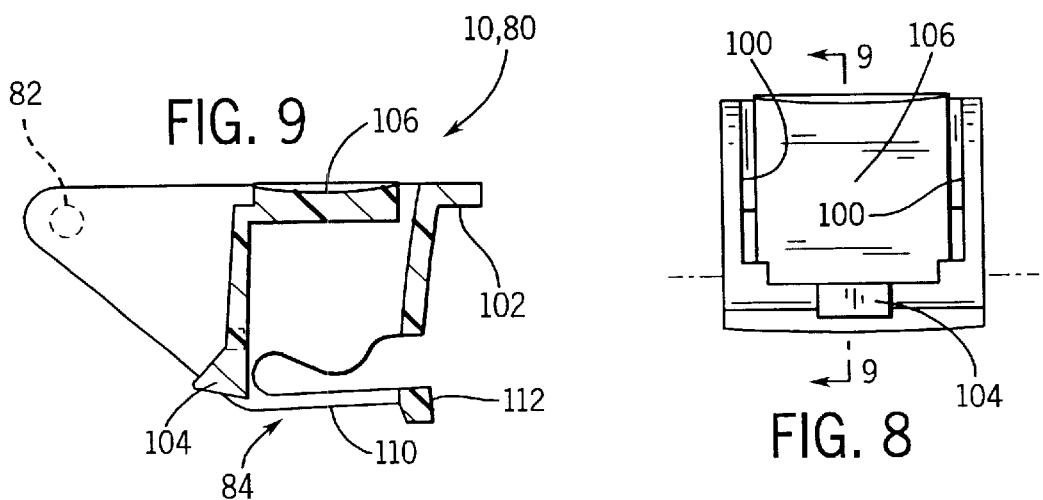
FIG. 8 is a rear view of an arm section of the tool-less latch assembly.

Exemplary features of the arm section 80 are illustrated in FIGS. 8 and 9, which are rear face and cross-sectional side views, respectively. As illustrated, the arm section 80 includes a grip 102 to facilitate rotation of the arm section 80 about the hinge assembly 82. The arm section 80 also has a biasing member 104, which is configured for toggling the interrupt member 78 in the base section 64 (e.g., as illustrated in FIG. 7) during rotation of the arm section 80 between latched and unlatched positions. An arm release 106 is also incorporated into the arm section 80 to facilitate locking and unlocking of the arm section 80 to the base section 64. The operation of the foregoing features is illustrated below with reference to FIGS. 10 through 12.

Figure 10:
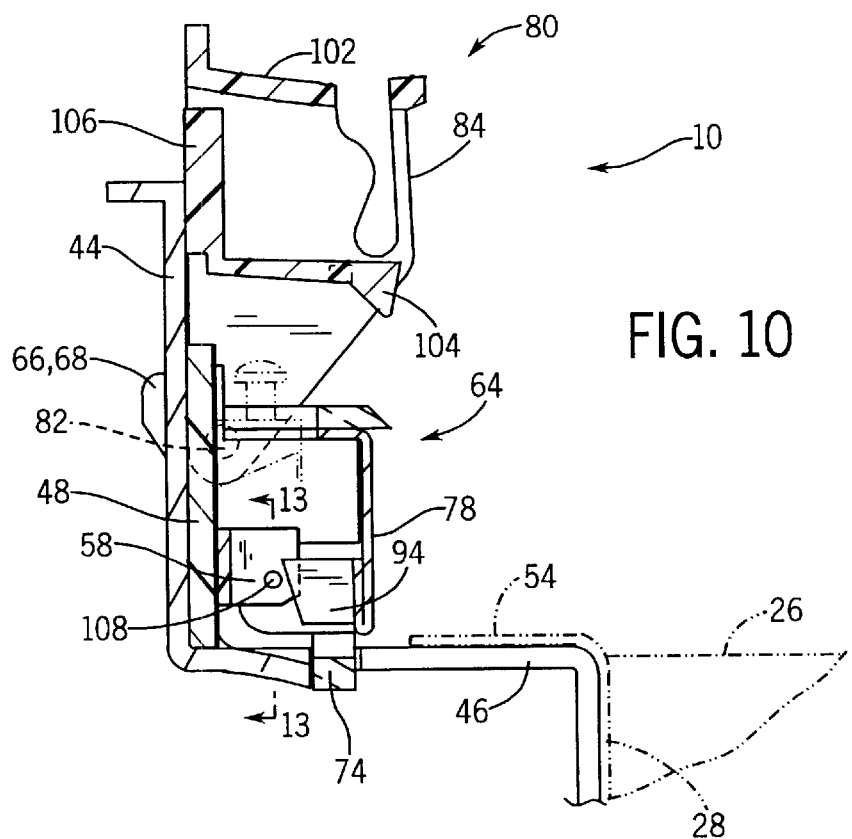
FIG. 10 is a cross-sectional side view of the open configuration, as illustrated in FIG. 3.
Figure 11:
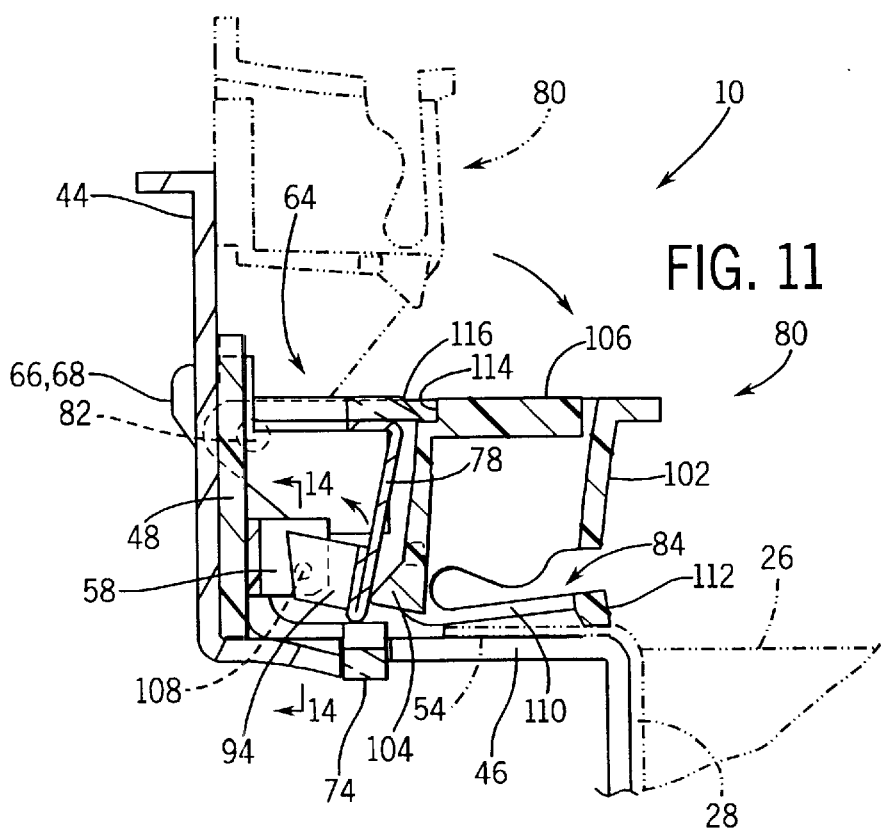
FIG. 11 is a cross-sectional side view of the closed configuration, as illustrated in FIG. 4.

FIGS. 10 and 11 are cross-sectional views of the tool-less latch assembly 52 in the unlatched and latched and orientations, respectively. As illustrated in FIG. 10, the base section 64 is disposed about the device switchboard 48. The base section 64 is tool-lessly and removably coupled to the latch mount chassis 42 via the hooks 66 and 68 and the curved tab 74. In the unlatched orientation of FIG. 10, the protruding member 94 of the interrupt member 78 does not interrupt the non-mechanical or wireless switch mechanism (e.g., wireless, magnetic or optical axis 108) of the switch 58. This unlatched orientation also allows the circuit board 26 to be freely inserted and removed from the electrical slot 24, as illustrated in FIG. 1.

The circuit board 26 is secured into the electrical slot 24 by rotating the arm section 80 about the hinge assembly 82 downwardly to the latched orientation, as illustrated in FIG. 11. In this latched orientation, the flexible latch member 84 of the arm section 80 is springably abutted against the lip 54 of the circuit board 26, thereby retaining the circuit board 26 in its slot 24 during operation, during shipping of the computing device 12, or during any other movement of the computing device 12. As discussed above, the flexible latch member 84 may embody a variety of geometries, materials, and a spring mechanisms. However, in this exemplary embodiment, the flexible latch member 84 embodies a relatively flat U-shaped geometry 110 having a protruding portion 112 to generate a spring force and to provide a focused retention force on the lip 54. As the arm section 80 is rotated into this latched orientation, the biasing member 104 is progressively moved inwardly against the interrupt member 78 of the base section 64. Accordingly, in the latched orientation, the protruding portion 94 of the interrupt member 78 is disposed between the wireless, magnetic or optical axis 108 of the switch 58 to toggle the switch 58 to a powered status (or any other desired status). The arm section 80 is also removably locked in the latched orientation, as a gap 114 of the arm release 106 is snap-fit below an adjacent lip 116 of the base section 64.

The arm section 80 is unlatched in a reverse procedure from that described above with reference to FIGS. 10 and 11. As illustrated in FIG. 12, the arm section 80 is released from the base section 64 by pressing the arm release 106 downwardly toward the horizontal panel 46, thereby moving the gap 114 away from the lip 116 and allowing the arm section 80 to be rotated upwardly about the hinge assembly 82. The grip 102 of the arm section 80 may be used in conjunction with the arm release 106 to provide leverage for the downward movement of the arm release 106 and upward rotation of the arm section 80 toward the unlatched orientation. For example, a user may place the thumb on the arm release 106 and the forefinger on the grip 102. Accordingly, as the user rotates the arm section 80 upwardly toward the unlatched orientation, the flexible latch member 84 is moved away from the lip 54, while the biasing member 104 is moved away from the interrupt member 78. This rotational movement of the arm section 80 simultaneously releases the circuit board 26 and allows the interrupt member 78 to springably return to a non-interrupting position (e.g., a power off status) relative to the wireless, magnetic or optical axis 108 of the switch 58. The circuit board 26 may then be safely removed from the electrical connector slot 24. The device switchboard 48 also may be removed from the latch mount chassis 42 by pressing the curved tab 74 and rotating the base section 64 about the hooks 66 and 68, as described above with reference to FIGS. 2 and 3.

The operation of the switch 58 is further illustrated in FIGS. 13 and 14. As illustrated in FIG. 13, the switch 58 includes transmitting and receiving members 118 and 120, respectively, for a wireless, magnetic or optical beam 122 (e.g., non-mechanical or wireless path) along the axis 108. This beam 122 may embody any sort of nonintrusive switch mechanism or technology, such as a laser beam, an IRDA beam, a radio frequency transmission, a magnetic field, or any other suitable wireless, non-mechanical or non-intrusive transmission within the scope of the present technique. As illustrated in FIG. 13, the beam 122 is successfully transmitted between the transmitting and receiving members 118 and 120. This corresponds to the unlatched orientation of the arm section 80, as illustrated in FIG. 10. FIG. 14 illustrates the switch 58 in the latched orientation of the arm section 80, as illustrated in FIG. 11. As illustrated, the protruding member 94 of the interrupt member 78 is disposed between the transmitting and receiving members 118 and 120, thereby blocking the beam 122 and changing the status of the switch 58.

While the invention may be susceptible to various modifications and alternative forms, specific embodiments have been shown by way of example in the drawings and have been described in detail herein. However, it should be understood that the invention is not intended to be limited to the particular forms disclosed. For example, the present technique may be applied to a variety of computing systems, computing components, and other electronic and computing devices, each having various components and features. Moreover, a broad spectrum of electronic and communication technologies can be employed within the scope of the present technique. For example, wireless communication, blue tooth technologies, optical and digital technologies, magnetic technologies, and other emerging technologies are all within the scope of the present technique. Accordingly, the invention is intended to cover all modifications, equivalents, and alternatives falling within the spirit and scope of the invention as defined by the following appended claims.

What is claimed is:

1. An attachment assembly for device boards for a computing device, comprising:
    a first latch portion comprising a tool-free mount structure coupled, to the computing device; and
    a second latch portion rotatably coupled to the first latch portion, wherein the second latch portion has a closed orientation securing a device board in a slot of the computing device.

2. The attachment assembly of claim 1, wherein the tool-free mount structure comprises a tool-free retainer configured for tool-lessly mounting a device control board to the computing device.

3. The attachment assembly of claim 1, wherein the first latch portion comprises a transparent material configured for transmitting light from a status indicator light.

4. The attachment assembly of claim 1, wherein the tool-free mount structure comprises a snap-fit mechanism.

5. The attachment assembly of claim 4, wherein the snap-fit mechanism comprises a hook member and a snap member.

6. The attachment assembly of claim 1, wherein the second latch portion comprises a release assembly configured for moving the second latch portion to an open orientation.

7. The attachment assembly of claim 6, wherein the release assembly comprises a non-mechanical power switch for the device board.

8. The attachment assembly of claim 1, comprising a shutdown initiation button configured to complete pending operations of the device board.

9. A system of controlling power for a device of a computer system for coupling and uncoupling of the device at a desired status of the computer system, comprising:
   a mechanical latch assembly for the device; and
   a power controlled switch assembly to control power to the device removably coupled to-the computer system, comprising:
      a signal module comprising a wireless path; and
      an interference member movably disposed between orientations clearing and blocking the wireless path, wherein the interference member is coupled to the mechanical latch.

10. The system of claim 9, wherein the signal module comprises an optical signal assembly.

11. The system of claim 9, wherein the mechanical latch assembly comprises a tool-free retainer mechanism for the device.

12. The system of claim 9, wherein the mechanical latch assembly comprises a transparent material configured for transmitting light from a status indicator light to interior and exterior areas of the computer system.

13. The system of claim 9, wherein the mechanical latch assembly comprises a tool-less mount section configured for tool-lessly coupling the mechanical latch to the computer system.

14. The system of claim 13, wherein the tool-less mount section comprises a securement section configured for tool-lessly securing a device control board to the computer system.

15. The system of claim 13, wherein the mechanical latch assembly comprises an arm section rotatably coupled to the tool-less mount section, the arm section having a closed orientation configured to secure the device in a slot of the computer system.

16. A device coupling assembly for a computer system, comprising:
   a power controlled switch assembly to control power to a slot for a device removably insertable into the slot;
   a power status light coupled to the power switch assembly; and
   a transparent member disposed adjacent the power status light for transmitting light from the power status light to interior and exterior portions of the computer system.

17. The device coupling assembly of claim 16, wherein the power switch assembly comprises a non-mechanical switch.

18. The device coupling assembly of claim 17, wherein the non-mechanical switch comprises a signal module and an interference member movably disposed between orientations clearing and blocking a wireless path produced by the signal module.

19. The device coupling assembly of claim 16, comprising a mechanical latch assembly for the device.

20. The device coupling assembly of claim 19, wherein the mechanical latch assembly comprises a tool-free mount section configured for tool-lessly coupling the mechanical latch to the computer system.

* * * * *

UNITED STATES PATENT AND TRADEMARK OFFICE
CERTIFICATE OF CORRECTION

PATENT NO. : 6,618,264 B2
DATED : September 9, 2003
INVENTOR(S) : George D. Megason et al.

It is certified that error appears in the above-identified patent and that said Letters Patent is hereby corrected as shown below:

Column 8,
Line 62, "coupled, to" should read -- coupled to --.

Column 9,
Line 25, "power controlled" should read -- power control --.
Line 26, "coupled to-the" should read -- coupled to the --.

Column 10,
Line 16, "power controlled" should read -- power control --.

Signed and Sealed this

Fifth Day of October, 2004

JON W. DUDAS
*Director of the United States Patent and Trademark Office*